United States Patent [19]

Hoffmann et al.

[11] Patent Number: 5,030,861
[45] Date of Patent: Jul. 9, 1991

[54] GATE CIRCUIT HAVING MOS TRANSISTORS

[75] Inventors: Kurt Hoffmann, Taufkirchen; Oskar Kowarik, Grafing; Rainer Kraus, Munich, all of Fed. Rep. of Germany

[73] Assignee: Siemens Aktiengesellschaft, Munich, Fed. Rep. of Germany

[21] Appl. No.: 445,687

[22] PCT Filed: Mar. 15, 1988

[86] PCT No.: PCT/DE88/00158
§ 371 Date: Nov. 16, 1989
§ 102(e) Date: Nov. 16, 1989

[87] PCT Pub. No.: WO88/07292
PCT Pub. Date: Sep. 22, 1988

[30] Foreign Application Priority Data

Mar. 16, 1987 [DE] Fed. Rep. of Germany ....... 3708534
Feb. 24, 1988 [DE] Fed. Rep. of Germany ....... 3805798

[51] Int. Cl.$^5$ ..................... H03K 19/017; H03K 5/24
[52] U.S. Cl. .................................. 307/571; 307/364; 307/480
[58] Field of Search ................ 307/571, 451, 364, 480

[56] References Cited

U.S. PATENT DOCUMENTS 4,468,574  8/1984  Engeler et al. ..................... 307/451
4,590,391  5/1986  Valley ................................. 307/355

OTHER PUBLICATIONS

IBM Tech. Disclosure Bulletin, vol. 23, #10, Mar. 1981, "Zero Power and Gate", Kraft, W. R.
Electronics, vol. 56, Sep. 1983, No. 19, pp. 144–148.

Primary Examiner—David Hudspeth
Assistant Examiner—Andrew Sanders
Attorney, Agent, or Firm—Herbert L. Lerner; Laurence A. Greenberg

[57] ABSTRACT

A circuit gives each of the input signals at its inputs to a common circuit previously charged to a supply voltage through transfer transistors. When the logical condition is satisfied the common circuit remains charged; otherwise the charge changes. This is detected by a discriminator circuit and the result is indicated at the circuit output. The circuit may be of AND-, OR-, NAND- and NOR design.

13 Claims, 4 Drawing Sheets

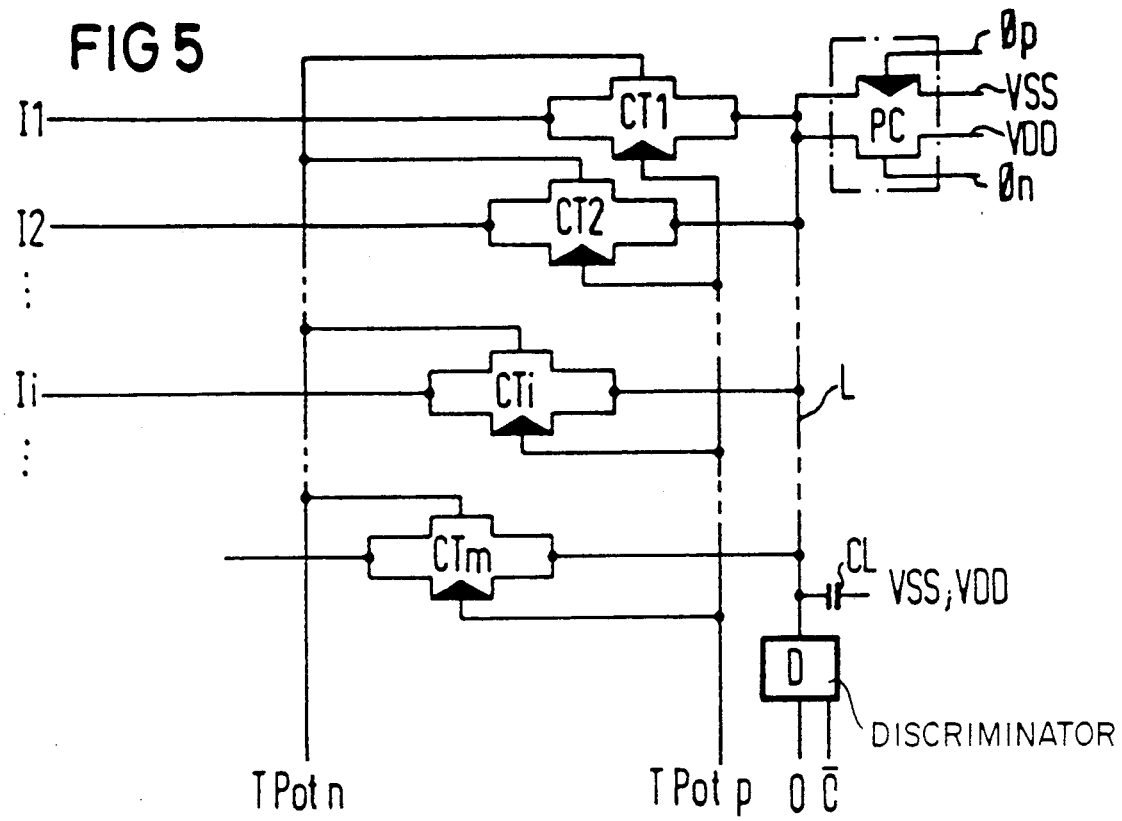
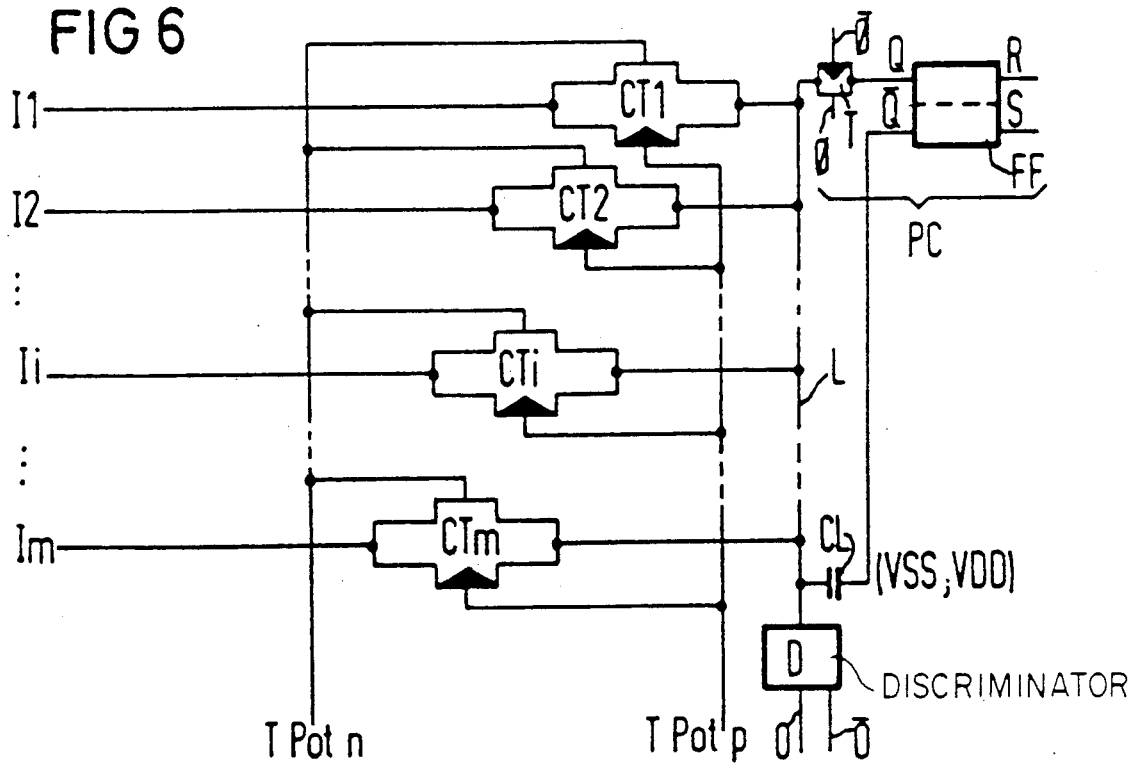

5,030,861

GATE CIRCUIT HAVING MOS TRANSISTORS

BACKGROUND OF THE INVENTION

1. Field of the Invention

The present invention relates to a gate circuit having MOS transistors.

2. Description of the Related Art

So-called open collector gate circuits are known in bipolar technology. By comparison with otherwise conventional gate circuits, they are distinguished by an uncomplicated electrical design, problem-free design options, and high fan-out (a standard for how many inputs of other components can be connected to one output).

In the field of MOS technology, no correspondingly simple gate circuit is thus far known.

The object of the present, invention is to devise a circuit of this generic type that is integratable, is as simple as possible in structure, and is as versatile in use as possible.

A configuration for switching data signals in multiplex operation is known from IBM Technical Disclosure Bulletin, Vol. 23, No. 10, March 1981, pp. 4394 and 4395. The switching of data signals in that device is controlled individually for each data signal.

Furthermore, "pass-transistor" networks for performing transfer logic functions are known from Electronics International, Vol. 56, Sept. 1983, No. 19, pp. 144-148. Once again, input data signals are controlled by individual control signals in that device.

SUMMARY OF THE INVENTION

The object of the present invention is to devise a circuit of this generic type that is integratable, is as simple as possible in structure, and is as versatile in use as possible.

With the foregoing and other objects in view there is provided, in accordance with the invention, a gate circuit having MOS transistors, comprising means for supplying a first supply potential, means for supplying a second supply potential, means for supplying a transfer potential having a value between the value of the first supply potential and one-half the potential difference between the first supply potential and the second supply potential, means for supplying at least one clock signal, m inputs, a common line, transfer transistors each being connected between a respective one of the m inputs and the common line, the transfer transistors having gates connected to the transfer potential supply means for blocking a given one of the transfer transistors upon application of the first supply potential to the m input connected to the given transfer transistor, a precharging device for precharging the common line, the precharging device being switched to the first supply potential by the at least one clock signal, and a discriminator circuit connected to the common line for detecting the electrical state of the common line, the discriminator circuit having an output forming an output of the gate circuit.

In accordance with another feature of the invention, the precharging device includes a flip-flop having an output to be switched into connection with the common line.

In accordance with a further feature of the invention, the precharging device includes a switching transistor having the same conduction type as the transfer transistors.

In accordance with an added feature of the invention, the precharging device includes a switching transistor having a conduction type opposite to that of the transfer transistors.

In accordance with an additional feature of the invention, the precharging device permits a selective charging of the common line to one of the supply potentials, the transfer potential is a first transfer potential, and the transfer transistors are first transfer transistors, and there are provided means for supplying a second transfer potential, and second transfer transistors having a conduction type opposite to that of the first transfer transistors and having gates, each of the second transfer transistors being connected in parallel with a respective one of the first transfer transistors forming a pair of transfer transistors, the gates of the transfer transistors of one conduction type being connected to the means for supplying the first transfer potential, and the gates of the transfer transistors of the other conduction type being connected to the means for supplying second transfer potential.

In accordance with yet another feature of the invention, there is provided a capacitor connected to the common line, the capacitor being fixedly or switchably connected to one of the supply potentials.

In accordance with yet a further feature of the invention, the transfer transistors have a transistor threshold voltage, and the discriminator circuit includes a CMOS inverter circuit connected between the means for supplying the first supply potential and the means for supplying the second supply potential, the inverter circuit having a switchover point between the value of the transfer potential and that of the first supply potential, minus the transistor threshold voltage of the transfer transistors.

In accordance with yet an added feature of the invention, the CMOS inverter circuit has transistors with an equal channel length, one of the transistors of the CMOS inverter circuit has a source connected to the means for supplying the first supply potential, another of the transistors of the CMOS inverter circuit has a source connected to the means for supplying the second supply potential, and the one transistor has a channel width being 10 to 20 times as great as the channel length of the other transistor.

In accordance with yet an additional feature of the invention, the CMOS inverter circuit has an output side, and there is provided a further inverter circuit connected to the output side of the CMOS inverter circuit.

In accordance with a concomitant feature of the invention, the transfer transistors have a threshold voltage, and the transfer potential has a value between the value of the second supply potential plus or minus the value of the threshold voltage of the transfer transistors and the value of the first supply potential.

The invention will be described in further detail below, referring to the drawing.

BRIEF DESCRIPTION OF THE DRAWINGS

FIGS. 1-6 are schematic circuit diagrams of examples of various advantageous embodiments of the invention.

DESCRIPTION OF THE PREFERRED EMBODIMENTS

Figure 1:
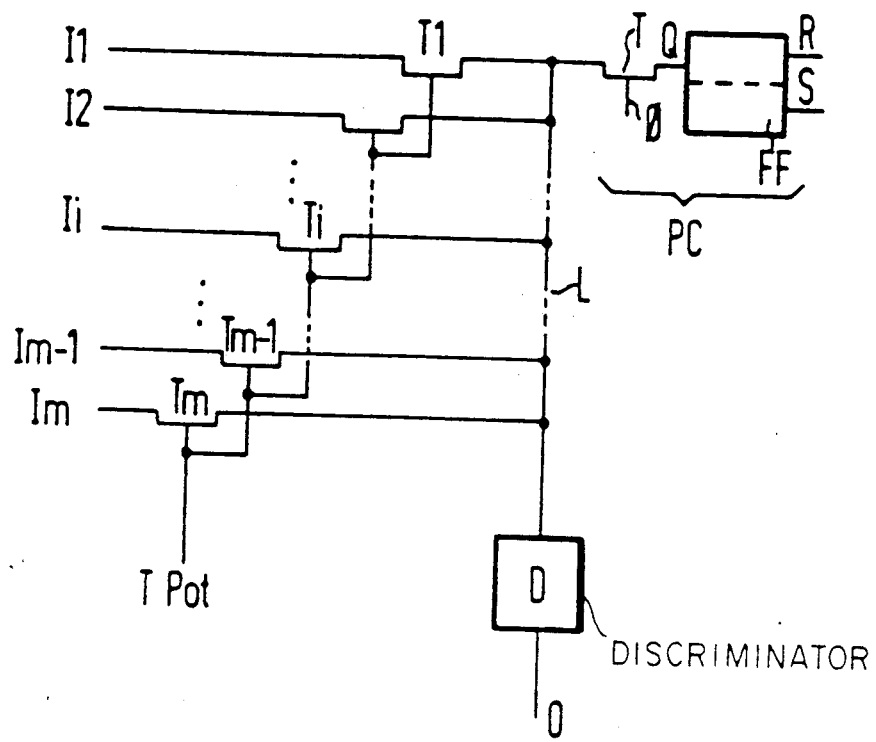

The embodiment of FIG. 1 shows the gate circuit according to the invention having m inputs I1-Im. Each input I1-Im is connected via a transfer transistor T1-Tm with a common line L. All the transfer transistors T1-Tm are connected at their gate to a transfer potential TPot.

The value of the transfer potential TPot is between the value of a first supply potential VDD and a value that is equal to one-half the potential difference between the first supply potential VDD and a second supply potential VSS. The common line L can be precharged to the first potential VDD via a precharging device PC, utilizing the intrinsic parasitic capacitances of this line. The common line L is also connected to a discriminator circuit D. This serves to detect the electrical state of the common line L. The output of the discriminator circuit D forms the output 0 of the entire gate circuit.

In the embodiment of FIG. 1, the precharging device PC includes a flip-flop circuit FF, preferably an RS flip-flop circuit. Its output Q is switchably connectged (via transistor T) to the common line L. By means of a clock signal 0 present at the gate of the transistor T, the precharging of the common line L to the first supply potential VDD is accordingly controllable.

The operation of the gate circuit according to the invention will now be described briefly, assuming so-called "positive logic" (that is logical 1 = "high"). From this discussion, one skilled in the art will be able to apply the so-called "negative logic" (logical 1 = "low") to the gate circuit according to the invention. First, in a precharging phase, the common line L is precharged to the first supply potential (in the embodiment of FIG. 1, this is VDD). To this end, the output Q of the flip-flop FF is set. While still in the precharging phase, the clock signal 0 then switches the transistor T so that it conducts, as a result of which the precharging itself is performed. Then, the clock signal 0 blocks the transistor T again.

Figure 2:
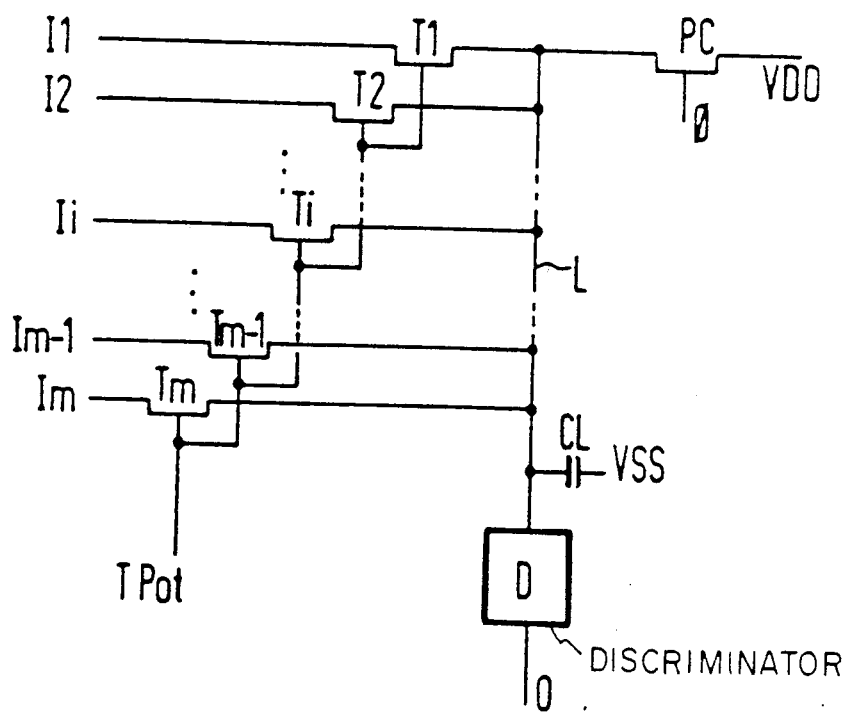

In the embodiment of FIG. 2, the precharging device includes a switching transistor, which is connected at its source directly to the first supply potential VDD. Its gate is in turn connected to the clock signal 0. This embodiment functions in principle precisely like the above-described embodiment having the flip-flop FF and the transistor T.

As is well known, each electrical line, regardless of whether it is integrated into an integrated circuit or not, has a certain intrinsic capacitance, which can be varied by design provisions (such as length, width, thickness). This intrinsic capacitance, after the precharging phase, makes it possible for the common line L to remain precharged to the first supply potential VDD for a predetermined minimum period t (t is a function of technically unavoidable leakage currents). In a further feature of the invention, it is possible as shown in FIG. 2 to reinforce this capacitively dictated property of the common line L by explicitly coupling a capacitor CL to the common line L. The free electrode of the capacitor CL is then connected either fixedly or switchably to the second supply potential VSS.

If a logical 1 (=first supply potential VDD) is now present at all the inputs I1-Im, then all the transfer transistors T1-Tm block, because a potential that is greater than the transfer potential TPot present at the gate is present at both the source and drain of each transfer transistor T1-Tm (assumption: the transfer transistors are of the n-channel conduction type).

The common line L thus remains precharged to the value of the first supply potential VDD. The discriminator circuit D connected to it recognizes this and at its output 0 emits a corresponding signal, for example having the value of the second supply potential VSS. If a logical 0 (=second supply potential VSS) is present at least one of the inputs I1-Im (for instance at the input Ii), however, then the transfer transistor associated with the input (in this example, Ti) conducts. Thus via this transfer transistor Ti, a charge can drain away from the common line L to the applicable input Ii. The common line L is thus pulled in the direction of logical 0 in terms of potential. This continues until such time as the transfer transistors T1-Tm the associated inputs I1-Im of which are at logical 1 begin to conduct. The result is an equilibrium at approximately TPot - Vth (Vth stands for the threshold voltage of the transfer transistors T1-Tm). The discriminator circuit D recognizes this and sets the output 0 correspondingly to the first supply potential VDD. In the example described thus far, the entire gate circuit functions as a NAND gate.

It is advantageous for the discriminator circuit D to include a CMOS inverter circuit, which is disposed between the two supply potentials VDD and VSS and is dimensioned such that its switchover point is located between the value of the transfer potential TPot and either that of the first supply potential VDD (operation as an AND or NAND gate), or that of the first supply potential VSS (operation as an OR or NOR gate; to be described below). In an advantageous embodiment, this dimensioning can be attained, on the assumption of an equal channel length of the transistors of the CMOS inverter circuit, by providing that the one of the transistors that is connected at its source to the first supply potential VDD (or VSS in the case of operation as an OR/NOR gate) has a channel width that is 10 to 20 times as great as the channel length of the other transistor that is connected at the source to the second supply potential VSS (or VDD).

Figure 7:
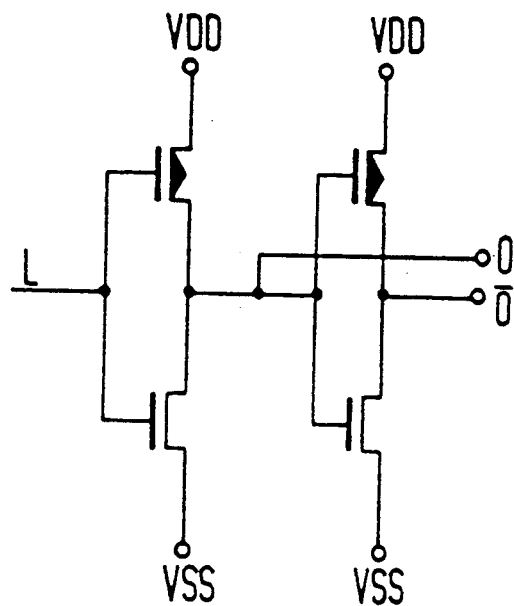
FIGS. 7 and 8 are circuit diagrams of embodiments of associated discriminator circuits.

In the special embodiment of FIG. 7, the CMOS inverter circuit of the actual discriminator circuit D is followed by a further inverter circuit, having an output ō complementary to the output o. With this embodiment, it is possible to operate the gate circuit according to the invention as both an AND and a NAND circuit, and as will be described below, as an OR or NOR circuit.

The switching transistor of the precharging device PC of FIG. 2 is advantageously of the same conduction type (n-channel) as the transfer transistors T1-Tm. In the likewise advantageous embodiment of FIG. 3, however, it is of the opposite conduction type (p-channel). This should be taken into account accordingly in the signal course of the clock signal 0.

Figure 4:
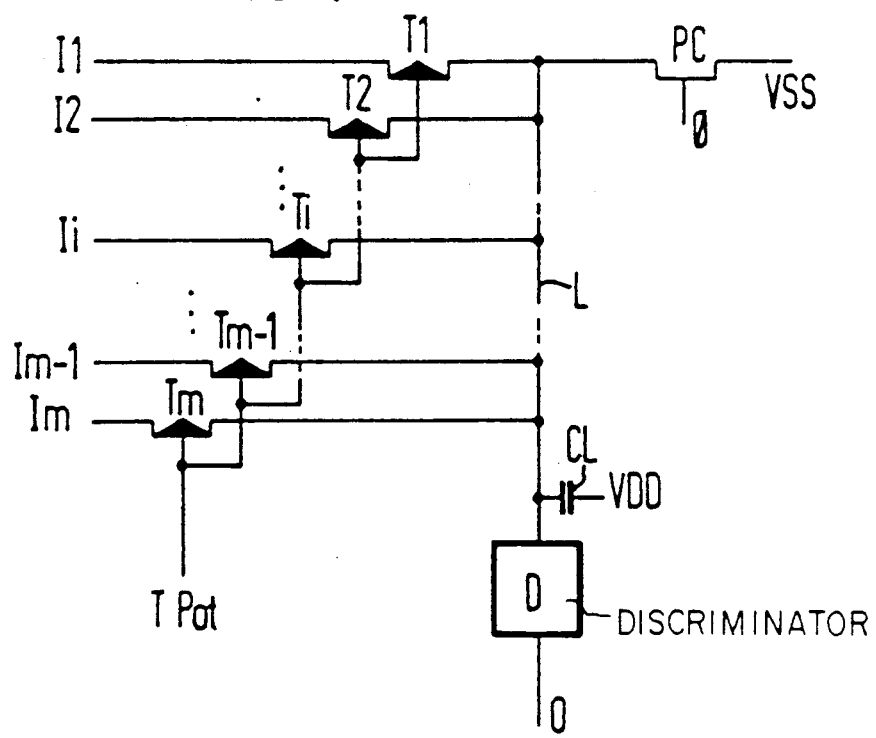

While the embodiments described thus far apply to an embodiment as an AND or NAND gate (positive logic is assumed), the embodiment of FIG. 4 is one as an OR or NOR gate: On the assumption that the supply potential VSS (so far called the second supply potential) is more-negative than the supply potential VDD (so far called the first supply potential), it is now assumed that the supply potential VSS is used as the first supply potential for FIG. 4, and the supply potential VDD is used as the second supply potential. The transfer transistors T1-Tm also have a conduction type (p-channel) opposite that (n-channel) of the previous embodiments.

Correspondingly, the value of the transfer potential TPot is also between the value of the first supply potential VSS and a value that is equal to one-half the potential difference between the first supply potential VSS and the second supply potential VDD. Furthermore, the common line L is precharged to the first supply potential VSS. In view of the above indications and the indications given previously for the operation of the embodiment of FIGS. 1-3, one skilled in the art will need no further details on the mode of operation.

FIGS. 5 and 6 show particularly advantageous embodiments: they can be operated as both an AND, NAND, or OR and NOR circuit, as a function of their mode of operation. Here each transfer transistor T1-Tm is replaced by a pair (CT1-CTm) of transistors parallel to one another, each having a conduction type opposite the other. The gates of the transistors of one conduction type are connected to a first transfer potential Tpotn, and the gates of the transfer transistors of the other conduction type are connected to a second transfer potential Tpotp. The two transfer potentials Tpotn, Tpotp can be applied independently but not simultaneously with one another. The latter option provides greater functional reliability.

Correspondingly, the precharging device PC of FIG. 5 also has two parallel transistors of either of the same conduction type (not shown) or opposite conduction type from one another. The transistor of the one conduction type is connected to the supply potential VSS. The transistor of the other conduction type is connected to the supply potential VDD. The gate of the transistor of the one conduction type is connected to a first clock signal 0p. The gate of the transistor of the other conduction type is connected to a second clock signal 0n.

The value of the first transfer potential Tpot is between the value of the supply potential VDD and a value that is equal to one-half the potential difference between the supply potential VDD and the supply potential VSS. Similarly, the value of the second transfer potential Tpot is between the value of the supply potential VSS and a value that is equal to one-half the potential difference between the supply potential VSS and the supply potential VDD.

If the circuit is to be operated as an AND/NAND gate, then the first transfer potential Tpot and the second clock signal 0n are to be applied. However, if the circuit is to be operated as an OR/NOR gate, then the second transfer potential Tpot and the first clock signal 0p should be applied. More detailed explanation will not be needed, in view of the discussion of FIGS. 1 and 4.

Figure 8:
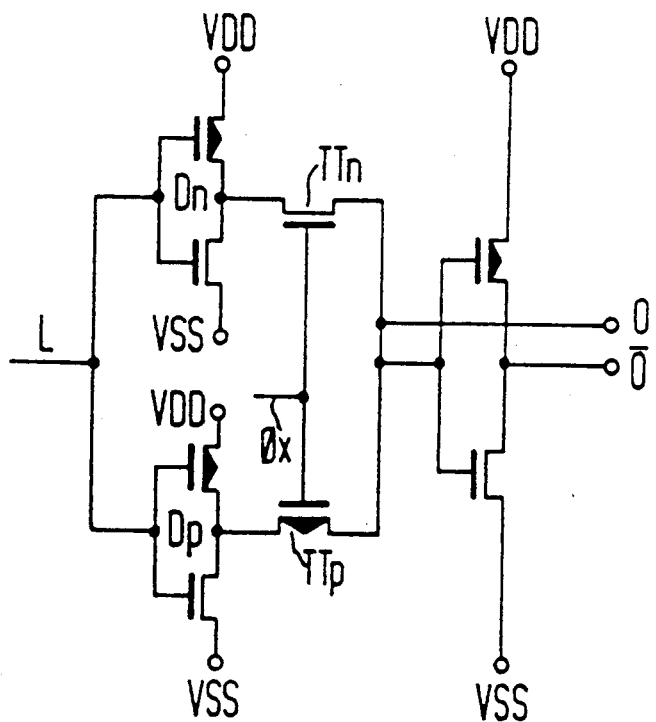

The special embodiment of the discriminator circuit D of FIG. 8 enables selective operation of the gate circuit according to the invention as an AND, NAND, OR and NOR gate. The discriminator circuit D of FIG. 8 includes a CMOS inverter Dp provided for operation as a NaNND/AND gate, the inverter having suitably asymmetrical dimensioning (as described above). Its output is connected via a transfer transistor TTn to the output o and via the further inverter, known from FIG. 7, to the output ō. The gate of the transfer transistor TTn is connected to a mode select signal Ox. The discriminator circuit D of FIG. 8 further includes a CMOS inverter Dp of suitable asymmetrical dimensioning (as already described) for operation as a NOR/OR gate. Its output is likewise connected to the output 0, via a further transfer transistor TTp, and via the further inverter known from FIG. 7 to the output ō.

Now if the mode select signal Ox during operation is applied to the supply potential VDD, then in the discriminator circuit D the transfer transistor TTn is conducting and the further transfer transistor TTp is blocked. The gate circuit thus functions as an AND/NAND circuit. Contrarily, if the mode select signal Ox is applied to the supply potential VSS, then in the discriminator circuit the transfer transistor TTn is blocked and the further transfer transistor TTp is conducting. The gate circuit thus operates as an OR/NOR circuit.

The embodiment of FIG. 6 differs from that of FIG. 5 in terms of the precharging circuit PC: The precharging circuit PC is substantially identical to that of FIG. 1; however, it includes either one transistor (as in FIG. 1) or parallelconnected transistors T having opposite conduction types, with correspondingly complementary clock signals 0, 0̄. Using a flip-flop FF enables the selective precharging of the common line L to the supply potentials VDD and VSS that is necessary for the selective operation as an AND/NAND, or OR/NOR gate. By using two transistors T of opposite conduction types, a voltage drop (which is otherwise typical, depending on precharging potential) at the level of the threshold voltage of a transistor T is avoided; (this could otherwise be avoided only if the clock signal 0 (or 0̄) has an excessive active level (in n-channel technology) or a diminished active level (in p-channel technology) as compared with the supply potentials.

A further advantage of the precharging according to FIG. 6 is that the complementary output Q̄, typically present in a flip-flop, can be connected to the capacitor CL. As a result, the capacitor CL is always (at least during the precharging phase) connected to both supply potentials VDD and VSS, regardless of the mode of the gate circuit (the common line L is of course precharged to one of the two supply potentials).

Figure 3:
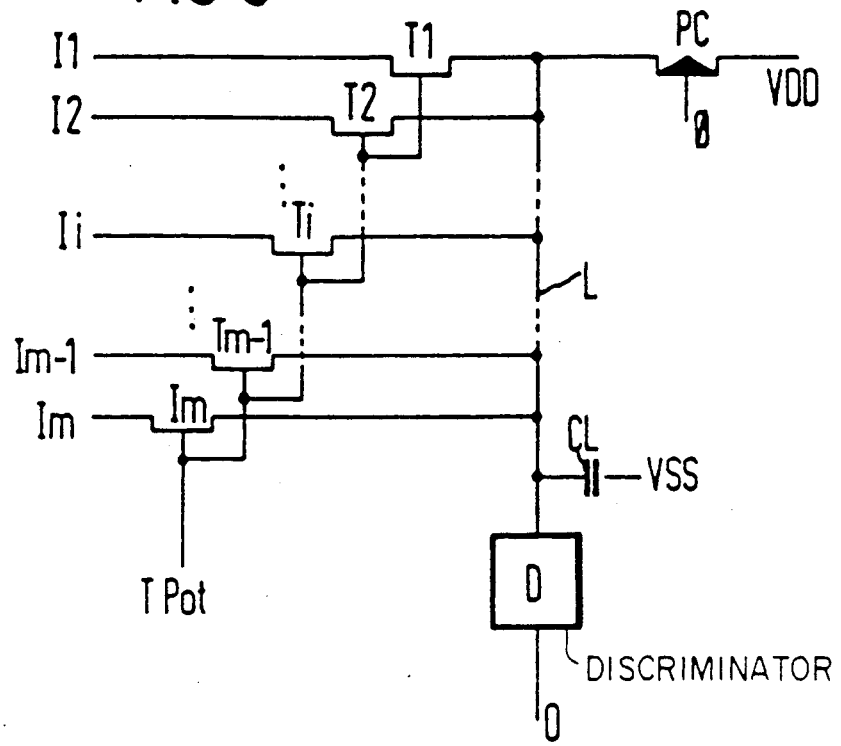

Further tests of circuits in accordance with FIGS. 1-3 have shown that it is also advantageous if the value of the transfer potential TPot is between the value of the first supply potential VDD and a value that is equal to the value of the second supply potential VSS, minus the threshold voltage Vth of the transfer transistors T1-Tm. Correspondingly, in terms of FIG. 4 it has been found that it is advantageous if the value of the transfer potential TPot is between the value of the first supply potential VSS and a value that is equal to the value of the second supply potential VDD, minus the threshold voltage Vth of the transfer transistors T1-Tm. The same applies to the embodiments of FIGS. 5 and 6.

The invention is particularly advantageously applicable to integrated semiconductor memories having a built-in parallel test device, as shown in German Published, Non-Prosecuted Application DE-OS 37 08 534.

We claim:

1. Gate circuit having MOS transistors, comprising means for supplying a first supply potential, means for supplying a second supply potential, means for supplying a transfer potential having a value between the value of said first supply potential and one-half the potential difference between said first supply potential and said second supply potential, means for supplying at least one clock signal;

m inputs, a common line, transfer transistors each being connected between a respective one of said m inputs and said common line;

each of said transistors having a gate connected to said transfer potential supply means for blocking said transfer transistors upon application of said first supply potential to a respective one of said m inputs connected to a given one of said transfer transistors;

a precharging device being connected to said common line for precharging said common line, said precharging device being switched to said first supply potential by said at least one clock signal, said clock signal being connected to said precharging device; and a discriminator circuit connected to said common line for detecting the electrical state of said common line, said discriminating circuit having an output forming an output of the gate circuit.

2. Gate circuit according to claim 1, wherein said precharging device includes a flip-flop having an output to be switched into connection with said common line.

3. Gate circuit according to claim 1, wherein said precharging device includes a switching transistor having the same conduction type as said transfer transistors.

4. Gate circuit according to claim 1, wherein said precharging device includes a switching transistor having a conduction type opposite to that of said transfer transistors.

5. Gate circuit according to claim 1, wherein said precharging device permits a selective charging of said common line to one of said supply potentials, said transfer potential is a first transfer potential, and said transfer transistors are first transfer transistors, and including means for supplying a second transfer potential, and second transfer transistors having a conduction type opposite to that of said first transfer transistors and having gates, each of said second transfer transistors being connected in parallel with a respective one of said first transfer transistors forming a pair of transfer transistors, the gates of said transfer transistors of one conduction type being connected to said means for supplying said first transfer potential, and the gates of said transfer transistors of the other conduction type being connected to said means for supplying second transfer potential.

6. Gate circuit according to claim 1, including a capacitor connected to said common line, said capacitor being connected to one of said supply potentials.

7. Gate circuit according to claim 1, including a capacitor connected to said common line, and means for connecting said capacitor to one of said supply potentials.

8. Gate circuit according to claim 1, wherein said transfer transistors have a transistor threshold voltage, and said discriminator circuit includes a CMOS inverter circuit connected between said means for supplying said first supply potential and said means for supplying said second supply potential, said inverter circuit having a switchover point between the value of said transfer potential and that of said first supply potential, minus said transistor threshold voltage of said transfer transistors.

9. Gate circuit according to claim 8, wherein said CMOS inverter circuit has transistors with an equal channel length, one of said transistors of said CMOS inverter circuit has a source connected to said means for supplying said first supply potential, another of said transistors of said CMOS inverter circuit has a source connected to said means for supplying said second supply potential, and said one transistor has a channel width being 10 and 20 times as great as the channel length of said other transistor.

10. Gate circuit according to claim 8, wherein said CMOS inverter circuit has an output side, and including a further invertor circuit connected to said output side of said CMOS inverter circuit.

11. Gate circuit according to claim 9, wherein said CMOS inverter circuit has an output side, and including a further inverter circuit connected to said output side of said CMOS inverter circuit.

12. Gate circuit according to claim 1, wherein said transfer transistors have a threshold voltage, and said transfer potential has a value between the value of said second supply potential plus the value of said threshold voltage of said transfer transistors and the value of said first supply potential.

13. Gate circuit according to claim 1, wherein said transfer transistors have a threshold voltage, and said transfer potential has a value between the value of said second supply potential minus the value of said threshold voltage of said transfer transistors and the value of said first supply potential.

* * * * *